(12) United States Patent
Wu et al.

(10) Patent No.: US 11,798,639 B2
(45) Date of Patent: Oct. 24, 2023

(54) MEMORY DEVICE AND OPERATION METHOD THEREOF

(71) Applicant: MACRONIX INTERNATIONAL CO., LTD., Hsinchu (TW)

(72) Inventors: Guan-Wei Wu, Zhubei (TW); Yao-Wen Chang, Zhubei (TW); Chun-Liang Lu, Kinmen County (TW); I-Chen Yang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 212 days.

(21) Appl. No.: 17/531,825

(22) Filed: Nov. 22, 2021

(65) Prior Publication Data
US 2023/0162805 A1    May 25, 2023

(51) Int. Cl.
| G11C 7/00 | (2006.01) |
| G11C 16/34 | (2006.01) |
| G11C 16/08 | (2006.01) |
| G11C 16/26 | (2006.01) |
| G11C 16/24 | (2006.01) |
| G11C 16/04 | (2006.01) |

(52) U.S. Cl.
CPC .......... *G11C 16/3427* (2013.01); *G11C 16/08* (2013.01); *G11C 16/24* (2013.01); *G11C 16/26* (2013.01); *G11C 16/0483* (2013.01)

(58) Field of Classification Search
CPC ....... G11C 7/1051; G11C 7/22; G11C 7/1072; G11C 7/1006; G11C 7/1066
USPC .................. 365/189.15, 189.14, 185.18, 203
See application file for complete search history.

(56) References Cited

U.S. PATENT DOCUMENTS

| 10,712,954 B2 * | 7/2020 | Kim ........................ G11C 29/52 |
| 2010/0090286 A1 * | 4/2010 | Lee ......................... H10B 43/20 |
| | | 257/E27.081 |

* cited by examiner

*Primary Examiner* — Son T Dinh
(74) *Attorney, Agent, or Firm* — McClure, Qualey & Rodack, LLP

(57) ABSTRACT

A memory device and an operation method thereof are disclosed. The memory device includes a P-well region, a common source line, a ground selection line, at least one dummy ground selection line, a plurality of word lines, at least one dummy string selection line, a string selection line, at least one bit line and at least one memory string. The gates of a plurality of memory cells of the memory string are connected to the word lines. The operation method includes the following steps. Performing a read operation and applying a read voltage on the selected word line. Applying a pass voltage on other unselected word lines and the ground selection lines, etc. Before ending of the read operation, firstly decreasing voltages of the string selection line and the dummy string selection line in advance, then increasing voltage of the bit line.

18 Claims, 7 Drawing Sheets

MEMORY DEVICE AND OPERATION METHOD THEREOF

TECHNICAL FIELD

The disclosure relates to a memory device and an operation method thereof, particularly relates to a three-dimensional NAND memory device and an operation method for reducing disturbance in read operations.

BACKGROUND

As semiconductor technology progresses, structure of memory devices has evolved from a planar form to a three-dimensional form. For three-dimensional memory devices, especially for the gate-all-around (GAA) structure, memory cells are not directly connected to the P-well, therefore, during specific access operations, the channel region of memory cells may be in a floating state.

Based on the above-mentioned structural characteristics of memory devices with GAA of the three-dimensional form, during specific access operations (especially read operations), hot carrier effects may occur in some word lines, resulting in the increased threshold voltage of transistors of memory cells on these word lines rises, which may cause read disturbance of these word lines.

Due to the miniaturization of the size of memory devices, the spacing between the word lines has been greatly decreased, furthermore, in response to practical applications which are complex and consuming computation resource, and operation number of program operations and read operations of memory device is also increased significantly, which may cause the technical problem of read disturbance more serious.

Therefore, skilled ones of related industries in this technical field are devoted to improve the operation method of three-dimensional memory devices, so as to decrease read disturbance between the word lines.

SUMMARY

According to one aspect of the disclosure, a memory device is provided, including a P-well region, a common source line, a ground selection line, at least one dummy ground selection line, a plurality of word lines, and at least one dummy string selection line, string selection line, at least one bit line, at least one memory string and control circuit. Wherein, the common source line is arranged in the adjacent P-type well region, and the word line is arranged between at least one dummy ground selection line and at least one dummy string selection line. At least one memory string is disposed between the common source line and the at least one bit line, and the gates of the plurality of memory cells of the at least one memory string are respectively connected to the word lines. The control circuit is used to select a word line from the word lines to perform a read operation, to apply a read voltage to the selected word line, and to apply a pass voltage to other unselected word lines, ground selection lines, at least a dummy ground selection line, a string selection line, and at least one dummy string selection line, wherein the pass voltage is greater than the read voltage. Before ending of the read operation, the control circuit is configured to firstly decrease the voltage of the string selection line and the at least one dummy string selection line in advance, after the voltages of the string selection line and the at least one dummy string selection line are decreased, then increase the voltage of the at least one bit line.

According to another aspect of the disclosure, a method for operating a memory device is provided, wherein the memory device includes a P-type well, a common source line, a ground selection line, at least one dummy ground selection line, and a plurality of word lines, at least one dummy string selection line, string selection line, at least one bit line and at least one memory string, the common source line is arranged in the adjacent P-well region, and the word line is arranged in at least one dummy between the ground selection line and the at least one dummy string selection line, at least one memory string is arranged between the common source line and the at least one bit line, and each of the plurality of memory cells of the at least one memory string The gates are respectively connected to the word lines, and the operation method includes the following steps. Select a word line from the word lines to perform a read operation to apply a read voltage to the selected word line, and apply a pass voltage to other unselected word lines, ground selection lines, and at least one dummy ground The selection line, the string selection line, and at least one dummy string selection line, wherein the pass voltage is greater than the read voltage. Before ending of the read operation, firstly, the voltage of the string selection line and the at least one dummy string selection line are decreased in advance, after the voltages of the string selection line and the at least one dummy string selection line are decreased, then the voltage of the at least one bit line is increased.

Figure 1:
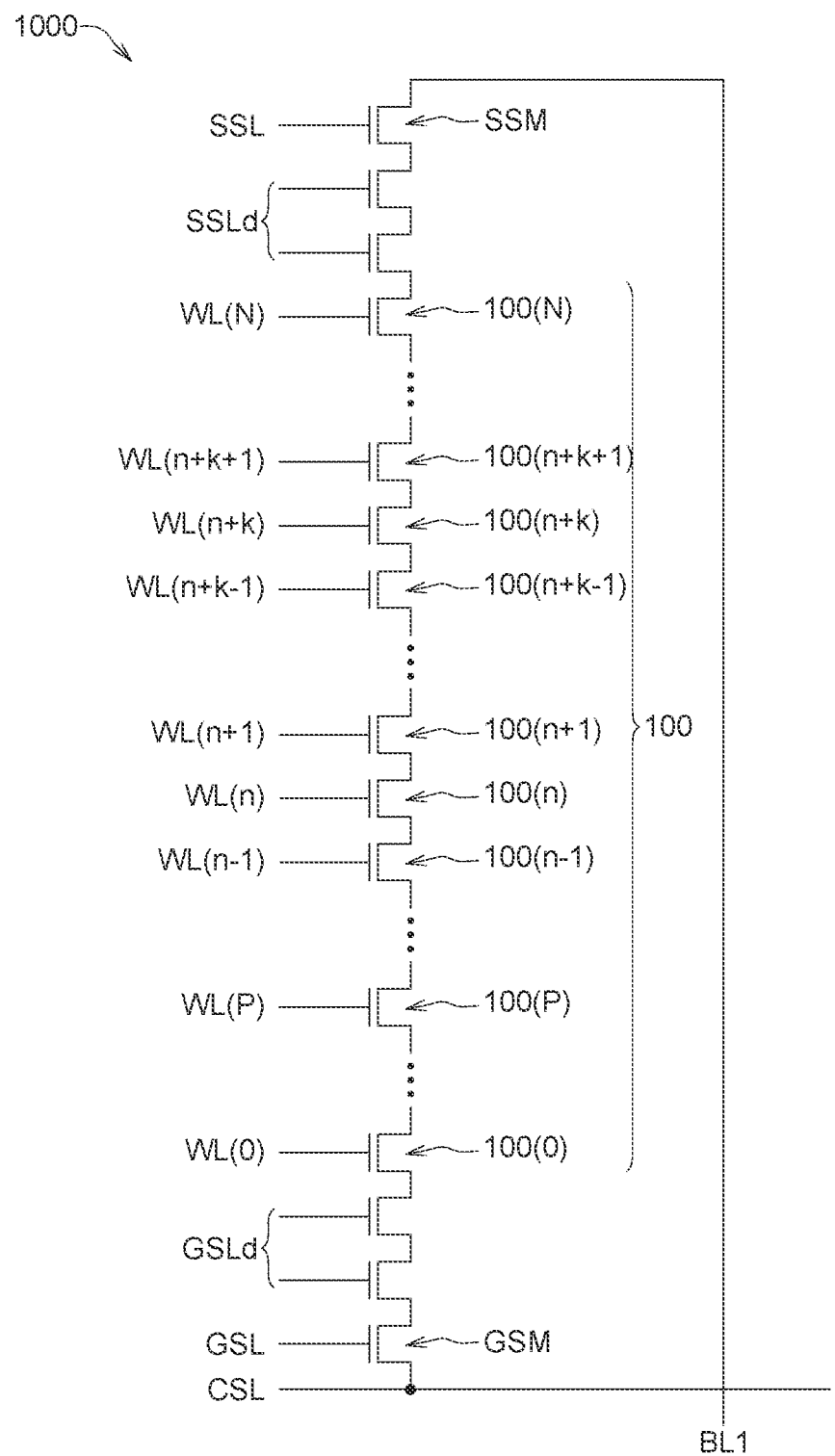
FIG. 1 is a schematic diagram of an equivalent circuit of a memory device of an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of an equivalent circuit of a memory device 1000 of an embodiment of the disclosure. Please refer to FIG. 1, the memory device 1000 of this embodiment may be, for example, a three-dimensional NAND flash memory device. The memory device 1000 includes at least one memory string 100. The memory string 100 is disposed in a three-dimensional form above the P-well (the P-well is not shown in FIG. 1). The memory string 100 includes a plurality of memory cells, and these memory cells include transistors 100(0)~100(N). In an example, the memory device 1000 has the three-dimensional gate-all-around (GAA) structure, and channel region of the transistors 100(0)~100(N) of the memory string 100 is surrounded by the gates of the transistors 100(0)~100(N). Therefore, the channel region of the transistors 100(0)~100(N) of the memory string 100 may be electrically isolated from the P-well region or other structural elements.

In addition, the memory device 1000 also includes a common source line CSL, a ground selection line GSL, at least one dummy ground selection line GSLd, a plurality of word lines WL(0)~WL(N), at least one dummy string selection line SSLd, a string selection line SSL and at least one bit line BL1. In the arrangement of the above-mentioned components, the common source line CSL is disposed adjacent to the P-well region (P-well region is not shown in FIG. 1), furthermore, the ground selection line GSL and the dummy ground selection line GSLd are disposed adjacent to the common source line CSL. Moreover, the word lines WL(0)~WL(N) are disposed between the dummy ground selection line GSLd and the dummy string selection line SSLd. In addition, the transistors 100(0)-100(N) of the memory cells of the memory string 100 are disposed and connected between the common source line CSL and the bit line BL1. The ground selection line GSL is connected to the gate of the ground selection transistor GSM, the string selection line SSL is connected to the gate of the serial selection transistor SSM, and the word lines WL(0)~WL(N) are respectively connected to the gates of the transistors 100(0)~100(N) of the memory cells of the memory string 100. In addition to the memory string 100, the memory device 1000 may include other memory strings (not shown in FIG. 1), and the word lines WL(0)~WL(N) may be connected to transistor gate of the memory cells of other memory strings.

The memory device 1000 may further include a control circuit (not shown in FIG. 1), the control circuit may control operation voltages applied on the word lines WL(0)~WL(N), the common source line CSL, the ground selection line GSL, the string selection line SSL and the bit line BL1, etc., to perform different types of access operations for the memory string 100, including program operations, verify operations, read operations or erase operations, etc. In an example, the memory string 100 may be performed with erase operations, and after the erase operations are completed, the transistors 100(0)~100(N) may be in an erase state and have a threshold voltage Vt of a low voltage level. Then, some of the word lines may be performed with program operations to write data. For example, the program operations may be performed on the memory cells connected to the first word line WL(n) and the second word line WL(n+k) among the word lines WL(0)~WL(N). After completion of the program operations, the transistor 100(n) connected to the first word line WL(n) and the transistor 100(n+k) connected to the second word line WL(n+k) may have threshold voltage Vt of high voltage level. The other transistors 100(0)~100(n−1), 100(n+1)~100(n+k−1) and 100(n+k+1)~100(N) which are not programmed, may remain at threshold voltage Vt of low voltage level. In this embodiment, the first word line WL(n) and the second word line WL(n+k) are not adjacent to each other, that is, "k" is a positive integer and "k" is greater than 1. Moreover, after the program operation is completed, the channel region of the memory string 100 located between the first word line WL(n) and the second word line WL(n+k) has a channel potential Vch.

After the program operation of the first word line WL(n) and the second word line WL(n+k), one word line WL(P) of the word lines WL(0)~WL(N) can be selected, and a read operation is performed on the memory cells connected to the selected word line WL(P). During the read operation, the control circuit may further control the voltages of the dummy string selection line SSLd, the string selection line SSL and the bit line BL1 to reduce possible read disturbance during the read operation. Please refer to the following descriptions for the operation method of the memory device 1000 to reduce the read disturbance during the read operation, and also refer to the timing diagrams of the operation voltages shown in FIGS. 2, 3A and 3B and the flow charts of the operation method shown in FIGS. 6A and 6B.

Figure 2:
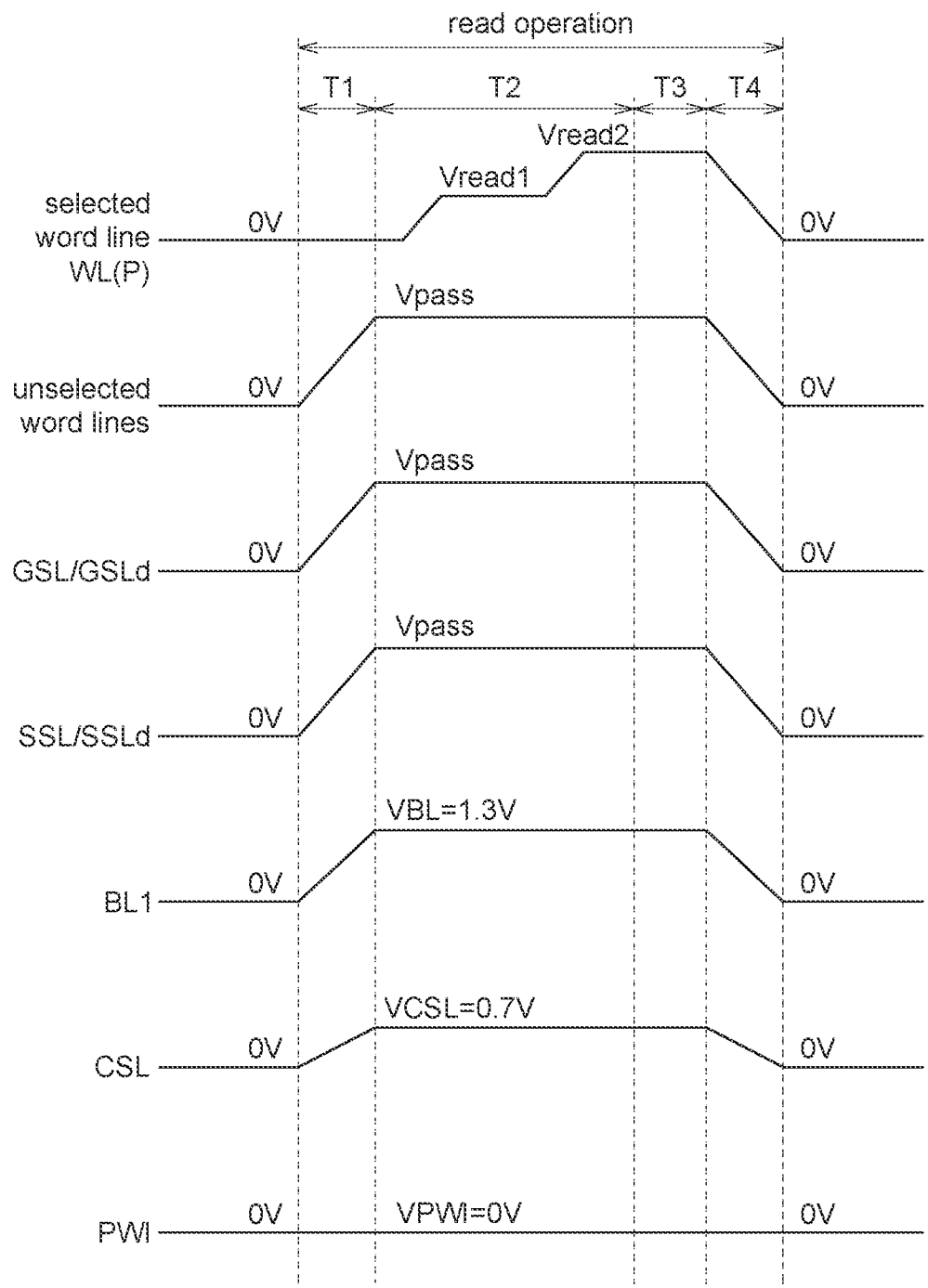
FIGS. 2, 3A and 3B are timing diagrams of the operating voltages of the memory device of an embodiment of the disclosure.
Figure 3A:
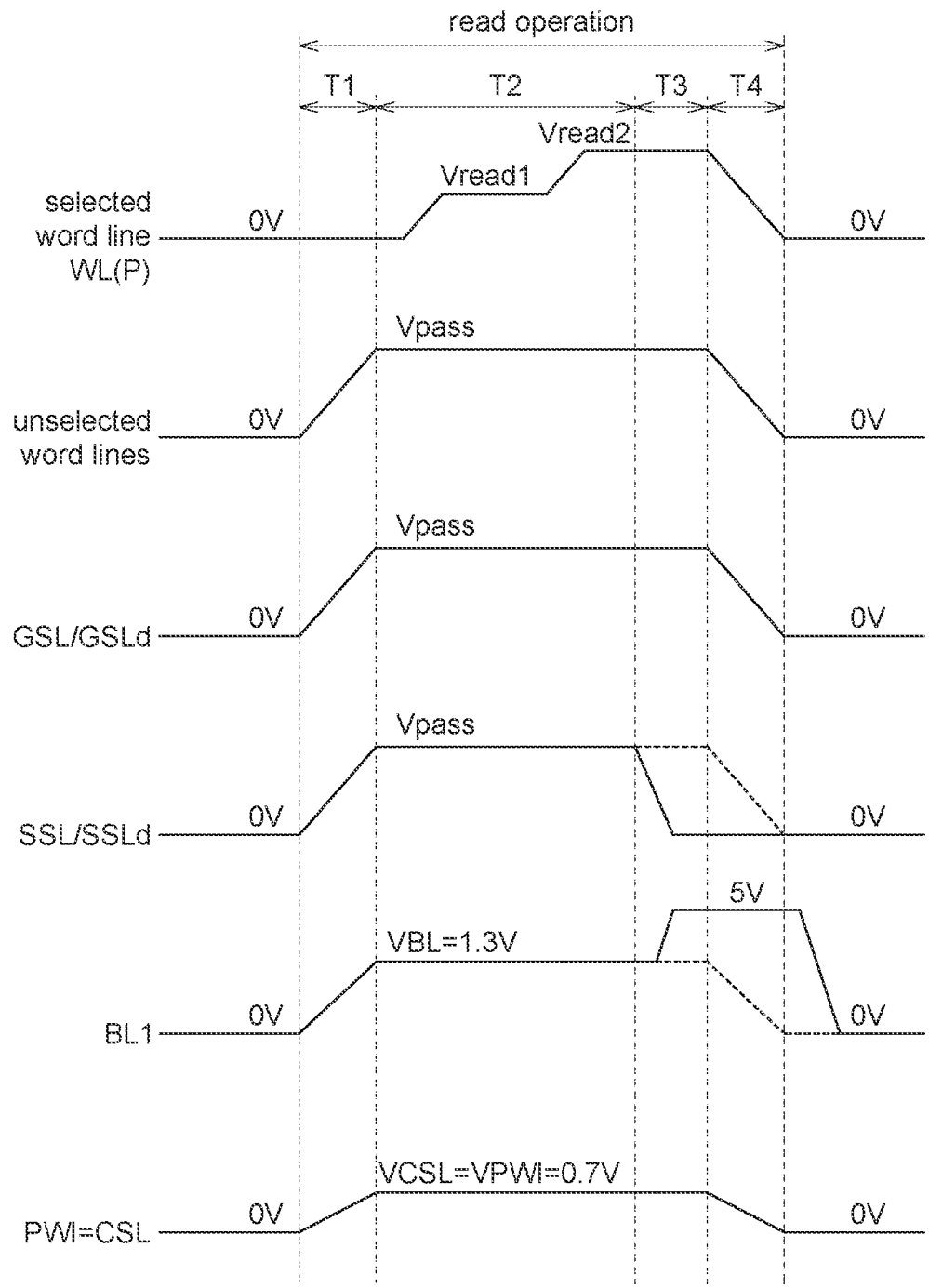
Figure 3B:
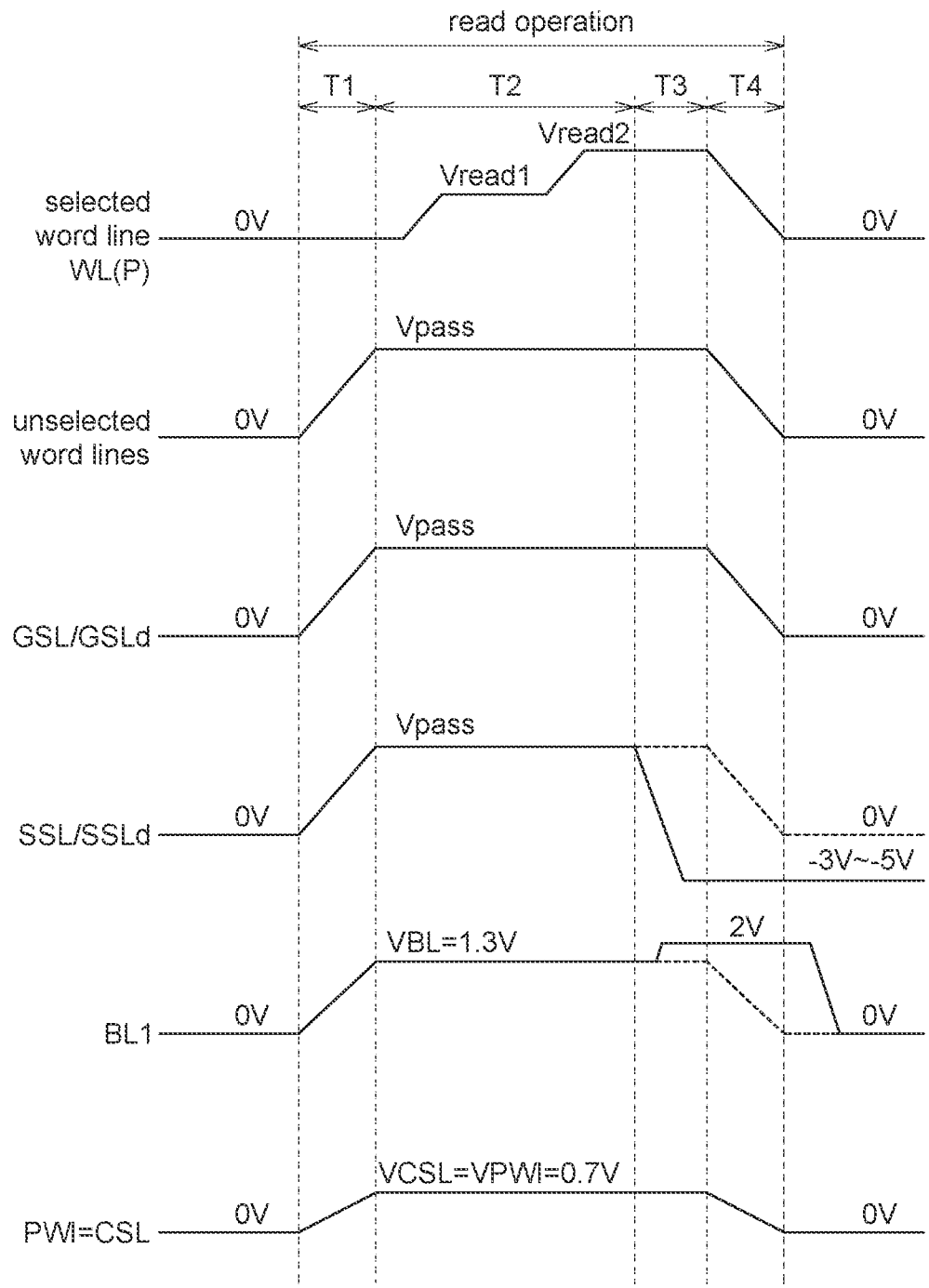
Figure 6A:
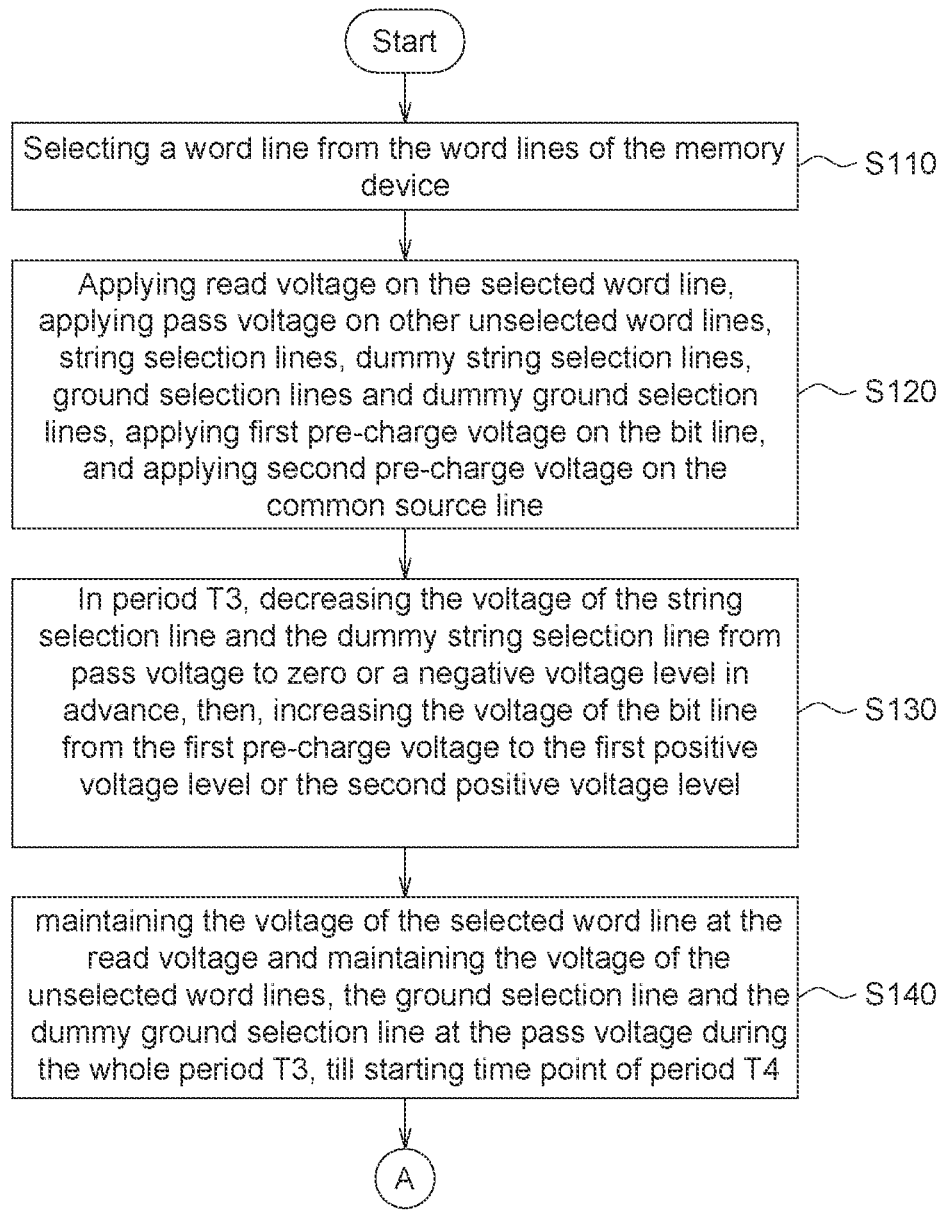
FIGS. 6A and 6B are flowcharts of the operation method of the memory device of an embodiment of the disclosure.
Figure 6B:
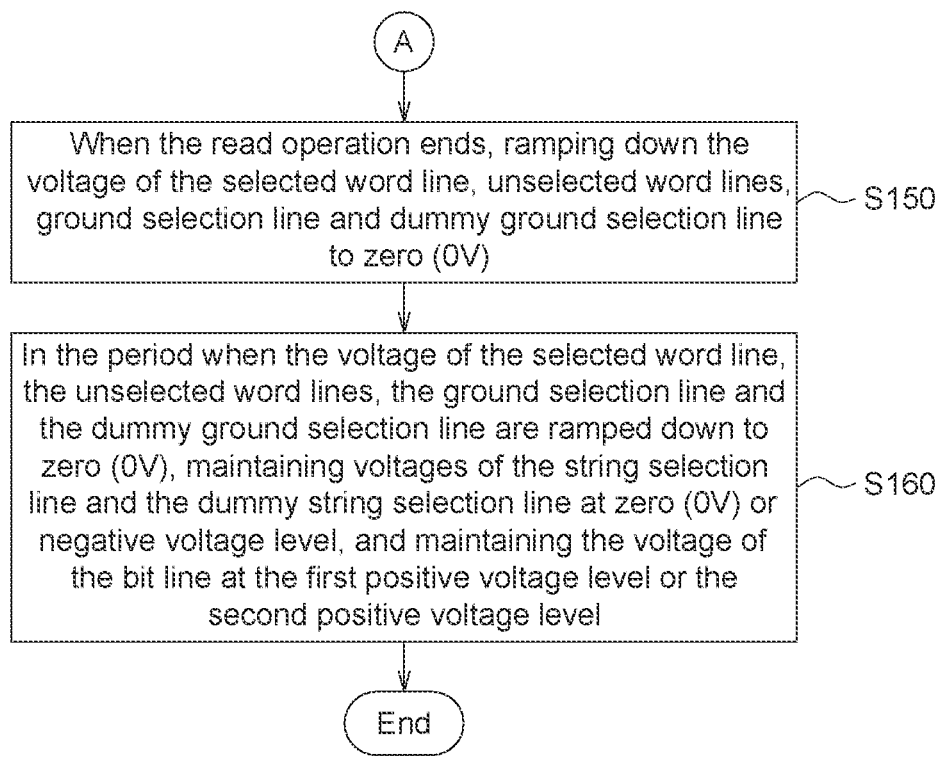

FIGS. 2, 3A and 3B are timing diagrams of the operating voltages of the memory device 1000 of an embodiment of the disclosure, and FIGS. 6A and 6B are flowcharts of the operation method of the memory device 1000 of an embodiment of the disclosure. First, please refer to FIG. 2 and FIG. 6A, in step S110, a word line WL(P) is selected among the word lines WL(0)~WL(N) of the memory device 1000, so as to perform a read operation on the transistor 100(p) of the memory cell connected to the word line WL(P). Then, in step S120, the read voltage Vread is applied on the selected word line WL(P). In this embodiment, the read voltage Vread may include two stages of read voltage Vread1 and read voltage Vread2. In addition, the pass voltage Vpass is applied on other unselected word lines, the ground selection line GSL, the dummy ground selection line GSLd, the string selection line SSL and the dummy string selection line SSLd. In this embodiment, the pass voltage Vpass is greater than the read voltage Vread1 and the read voltage Vread2. In addition, a first pre-charge voltage VBL (for example, 1.3V) is applied on the bit line BL1, and a second pre-charge voltage VCSL (for example, 0.7V) is applied on the common source line CSL.

More specifically, in the period T1 during the read operation, voltages of the unselected word lines, ground selection line GSL, dummy ground selection line GSLd, string selection line SSL, and dummy string selection line SSLd are ramped up from zero (0V) to the pass voltage Vpass, and voltage of the bit line BL1 is ramped up from zero (0V) to the first pre-charge voltage VBL. Furthermore, voltage of the common source line CSL is ramped up from zero (0V) to the second pre-charge voltage VCSL. Then, in the period T2 during the read operation, voltages of the unselected word lines, the ground selection line GSL, the dummy ground selection line GSLd, the string selection line SSL and the dummy string selection line SSLd are maintained at the pass voltage Vpass, voltage of the bit line BL1 is maintained at the first pre-charge voltage VBL, and voltage of the common source line CSL is maintained at the second pre-charge voltage VCSL.

On the other hand, in the period T2 during the read operation, voltage of the selected word line WL(P) is ramped up from zero (0V) to the read voltage Vread1, and then further ramped up to the read voltage Vread2. In addition, in the period T1 and the period T2 during the read operation, the voltage VPWI of the P-well region PWI is maintained at zero (0V).

As shown in FIG. 2, in the period T3 (period T3 is before ending of the read operation), voltages of the unselected word line, the ground selection line GSL, the dummy ground selection line GSLd, the string selection line SSL, and the dummy string selection line SSLd are still maintained at the pass voltage Vpass. Furthermore, voltage of the bit line BL1 is still maintained at the first pre-charge voltage VBL, and the common source line CSL is still maintained at the second pre-charge voltage VCSL. Then, in the period T4 (period T4 is near ending of the read operation), voltages of the unselected word line, the ground selection line GSL, the dummy ground selection line GSLd, the string selection line SSL, the dummy string selection line SSLd, the bit line BL1 and the common source line CSL are ramped down to zero (0V). In addition, the voltage VPWI of the P-well region PWI remains at zero (0V) during the period T3 and the period T4.

Figure 4:
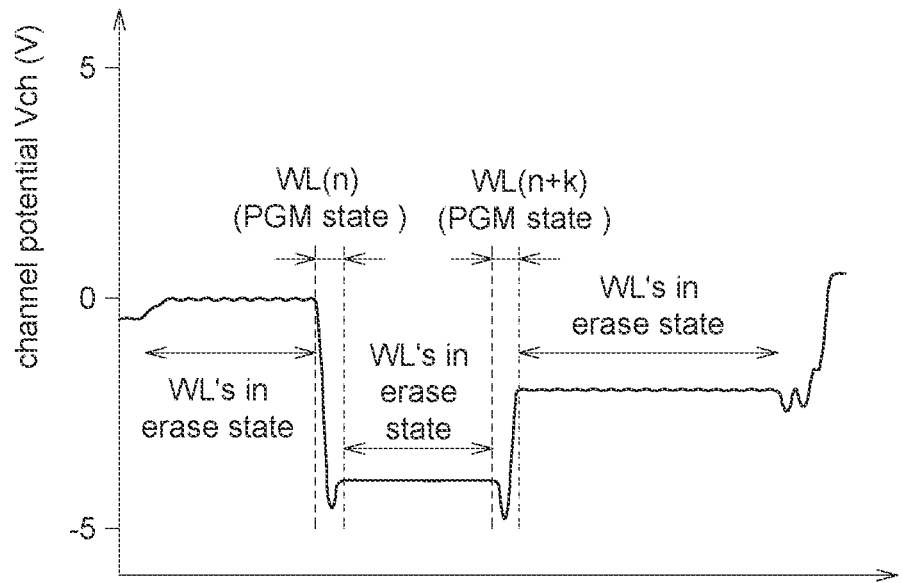
FIGS. 4 and 5 are diagrams of potential distribution of the memory string of the memory device of an embodiment of the disclosure.

From the above, in the period T4, the voltage of the selected bit line WL(P) is ramped down from the read voltage Vread2 to zero (0V), and the voltages of the unselected bit line are ramped down from pass voltage Vpass to zero (0V). When the above operating voltages drop below the threshold voltage Vt of the transistor 100(n) connected to the first word line WL(n) and the transistor 100(n+k) connected to the second word line WL(n+k), the transistors 100(n) and 100(n+k) will be turned off, causing channel region of the memory string 100 located between the first word line WL(n) and the second word line WL(n+k) to be in a floating state. Then, when the voltages of the selected bit line WL(P) and the unselected bit line continue to drop to zero (0V), channel potential Vch of the channel region located between the first word line WL(n) and the second word line WL(n+k) will be down-coupled to a negative voltage level lower than zero (0V). Also refer to diagrams of potential distribution of the memory string 100 of the memory device 1000 shown in FIG. 4, where the channel potential Vch of the channel region the memory string 100 located between the first word line WL(n) and the second word line WL(n+k) is coupled down to a negative voltage level of approximately −4V. Therefore, a large potential difference may be formed between the first word line WL(n) and the adjacent word line WL(n−1), which may cause hot electron current (also known as "hot carrier current") to be generated in the channel region between the first word line WL(n) and the adjacent word line WL(n−1). The hot carrier current may cause the threshold voltage Vt of the transistor of the memory cell on the word line WL(n−1) to increase (increasing gradually with the number of read operations) and may cause read disturbance. Similarly, a large potential difference is also formed between the second word line WL(n+k) and the adjacent word line WL(n+k+1), which may lead to the generation of hot carrier current and result in increased threshold voltage Vt of the transistor of the memory cell on the word line WL(n+k+1).

In order to reduce the above-mentioned disturbance of the hot carrier current, the voltage of the string selection line SSL, the dummy string selection line SSLd and the bit line BL1 may be controlled before the ending of the read operation, so as to generate band-to-band hot hole current to introduce into the channel region of the memory string 100 and eliminate down-coupled channel potential. Please refer to FIGS. 3A, 3B and 6A for detailed operation methods. In step S130, in beginning (i.e., starting time point) of the period T3 (the period T3 is before ending of the read operation), firstly, the voltages of the string selection line SSL and the dummy string selection line SSLd are decreased from the pass voltage Vpass to zero (0V) or a negative voltage level (for example, −3V to −5V) in advance. After voltages of the string selection line SSL and the dummy string selection line SSLd are decreased, then, voltage of the bit line BL1 is increased from the first pre-charge voltage VBL to a first positive voltage level (for example, 5V) or a second positive voltage level (for example, 2V). From the above, in the example of FIG. 3A, firstly the voltages of the string selection line SSL and the dummy string selection line SSLd are decreased from the pass voltage Vpass to zero (0V) in advance. After voltages of the string selection line SSL and the dummy string selection line SSLd are decreased, then the voltage of the bit line BL1 is increased from the first pre-charge voltage VBL to the first positive voltage level (for example, 5V). In the example of FIG. 3A, there is a sufficient potential difference (5V) between the bit line BL1, the string selection line SSL and the dummy string selection line SSLd, which can cause band-to-band hot hole current to be generated in the junction region of bit line BL1. On the other hand, in the example of FIG. 3B, firstly the voltages of the string selection line SSL and the dummy string selection line SSLd are decreased from the pass voltage Vpass to a lower negative voltage level (for example, −3V to −5V) in advance. After voltages of the string selection line SSL and the dummy string selection line SSLd are decreased, then voltage of the bit line BL1 is increased from the first pre-charge voltage VBL to a second positive voltage level (for example, 2V). The second positive voltage level may be lower than the first positive voltage level (for example, 5V) of the example of FIG. 3A. In the example of FIG. 3B, there is still a sufficient potential difference (5V) between the bit line BL1, the string selection line SSL, and the dummy string selection line SSLd, which can cause band-to-band hot hole current to be generated in the junction region of the bit line BL1.

Then, in step S140, the voltage of the selected word line WL(P) is maintained at the read voltage Vread2, and voltage of the unselected word lines, the ground selection line GSL and the dummy ground selection line GSLd are maintained at the pass voltage Vpass for the whole period T3, till starting time point of the period T4.

Then, referring to FIG. 6B, in step S150, in the period T4, voltages of the selected word line WL(P), the unselected word lines, the ground selection line GSL and the dummy ground selection line GSLd are ramped down to zero (0V) when of the read operation ends.

In addition, in step S160, in the period when the voltages of the selected word line WL(P), the unselected word lines, the ground selection line GSL and the dummy ground selection line GSLd are ramped down to zero (0V), maintaining the voltage of the string selection line SSL and the dummy string selection line SSLd at zero (0V) or the negative voltage level (for example, −3V to −5V), and maintaining the voltage of the bit line BL1 at the first positive voltage level (for example, 5V) or the second positive voltage level (for example, 2V).

In another example, in order to more effectively maintain the band-to-band hot hole current in the channel region between the first word line WL(n) and the second word line WL(n+k), the common source line CSL and the P-well region PWI may be electrically connected, so that the common source line CSL and the P-well region PWI are formed as being equal potential. Furthermore, in the period T2 and the period T3 during the read operation, the voltage VCSL of the common source line CSL and the voltage VPWI of the P-well region PWI are maintained at the second pre-charge voltage (0.7V) (i.e., VCSL=VPWI=0.7V), so that the potential of the P-type well region may be higher than the channel potential Vch of the channel region between the first word line WL(n) and the second word line WL(n+k).

Figure 5:
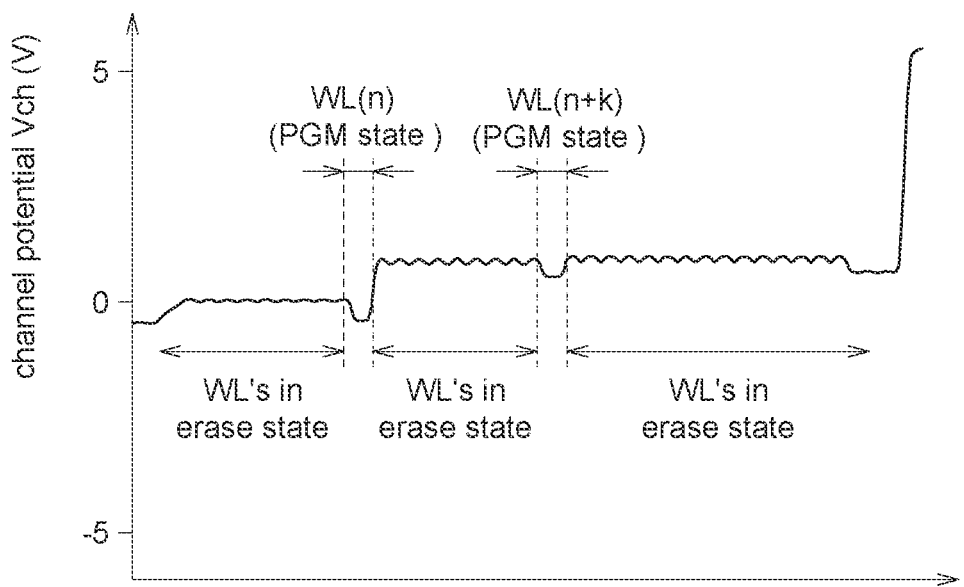

In summary, during the read operation of the memory device 1000, voltages of the bit line BL1, the string selection line SSL and the dummy string selection line SSLd can be controlled so that there is a sufficient potential difference between the bit line BL1, the string selection line SSL and the dummy string selection line SSLd, which can cause the junction region of the bit line BL1 to generate band-to-band hot hole current to eliminate down-coupled channel potential between the first word line WL(n) and the second word line WL(n+k), thereby reducing read disturbance caused by the hot carrier current. Please also refer to the diagram of voltage level distribution of the memory string 100 shown in FIG. 5, after band-to-band hot hole current is introduced to eliminate down-coupled channel potential in the channel region between the first word line WL(n) and the second word line WL(n+k), the channel potential Vch substantially remains at a positive voltage level, being not down-coupled. Therefore, hot carrier current will not generate between the first word line WL(n) and the adjacent word line WL(n−1) (or the second word line WL(n+k) and the adjacent word line WL(n)+k+1)).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
    a P-well region, a common source line, a ground selection line, at least one dummy ground selection line, a plurality of word lines, at least one dummy string selection line, a string selection line and at least one bit line, wherein the common source line is disposed adjacent to the P-well region, and the word lines are disposed between the at least one dummy ground selection line and the at least one dummy string selection line;
    at least one memory string, disposed between the common source line and the at least one bit line, and the gates of a plurality of memory cells of the at least one memory string are respectively connected to the word lines; and
    a control circuit, configured to select a word line from the word lines to perform a read operation, to apply a read voltage on the selected word line and to apply a pass voltage on other unselected word lines, the ground selection line, the at least one dummy ground selection line, the string selection line and the at least one dummy string selection line, the pass voltage is greater than the read voltage,
    wherein, before ending of the read operation, the control circuit is configured to firstly decrease the voltages of the string selection line and the at least one dummy string selection line in advance, after the voltages of the string selection line and the at least one dummy string selection line are decreased, then increase the voltage of the at least one bit line.

2. The memory device according to claim 1, wherein, before performing the read operation, a plurality of memory cells connected to a first word line and a second word line of the word lines have been performed a program operation and have a higher threshold voltage, the first word line is not adjacent to the second word line, and a channel region of the at least one memory string located between the first word line and the second word line has a channel potential.

3. The memory device according to claim 2, wherein, before ending of the read operation, the control circuit is configured to increase the voltage of the at least one bit line in advance so as to generate band-to-band hot hole current in a junction region of the at least one bit line, and to introduce the band-to-band hot hole current into the channel region of the at least one memory string to eliminate down-coupled the channel potential.

4. The memory device according to claim 3, wherein, before ending of the read operation, the control circuit is configured to firstly decrease the voltages of the string selection line and the at least one dummy string selection line from the pass voltage to zero (0V) or a negative voltage level in advance, after the voltages of the string selection line and the at least one dummy string selection line are decreased, then increase the voltage of the at least one bit line from a first pre-charge voltage to a first positive voltage level or a second positive voltage level.

5. The memory device according to claim 4, wherein, if the voltages of the string selection line and the at least one dummy string selection line are decreased from the pass voltage to zero (0V) in advance, then the voltage of the at least one bit line is increased from the first pre-charge voltage to the first positive voltage level, if the voltages of the string selection line and the at least one dummy string selection line are decreased from the pass voltage to the negative voltage level in advance, then the voltage of the at least one bit line is increased from the first pre-charge voltage to the second positive voltage level, and the second positive voltage level is lower than the first positive voltage level.

6. The memory device according to claim 4, wherein, the control circuit is configured to maintain the voltage of the selected word line at the read voltage, and maintain the voltages of the other unselected word lines, the ground selection line and the at least one dummy ground selection line at the pass voltage, then, when the read operation ends, the control circuit is configured to ramp down the voltages of the selected word line, the other unselected word lines, the ground selection line and the at least one dummy ground selection line to zero (0V).

7. The memory device according to claim 6, wherein, when the read operation ends, in the period the voltages of the selected word line, the other unselected word lines, the ground selection line and the at least one dummy ground selection line are ramped down to zero (0V), the control circuit is configured to maintain the voltages of the string selection line and the at least one dummy string selection line at zero (0V) or the negative voltage level, and maintain the voltage of the at least one bit line at the first positive voltage level or the second positive voltage level.

8. The memory device according to claim 4, wherein, before ending of the read operation, the control circuit is configured to decrease the voltages of the string selection line and the at least one dummy string selection line from the pass voltage to zero (0V) or the negative voltage level in advance to turn off at least one string selection transistor on the string selection line or the at least one dummy string selection line.

9. The memory device according to claim 4, wherein, the common source line and the P-well region are connected as having equal potential, and the control circuit is configured to maintain the voltages of the common source line and the P-well region at a second pre-charge voltage.

10. An operating method of a memory device, wherein, the memory device comprises a P-well region, a common source line, a ground selection line, at least one dummy ground selection line, a plurality of word lines, at least one dummy string selection line, a string selection line, at least one bit line and at least one memory string, the common source line is disposed adjacent to the P-well region, the word lines are disposed between the at least one dummy ground selection line and the at least one dummy string selection line, the at least one memory string is disposed between the common source line and the at least one bit line, and the gates of a plurality of memory cells of the at least one memory string are respectively connected to the word lines, and the operation method comprising:

selecting a word line from the word lines to perform a read operation;

applying a read voltage on the selected word line;

applying a pass voltage on other unselected words, the ground selection line, the at least one dummy ground selection line, the string selection line and the at least one dummy string selection line, the pass voltage is greater than the read voltage; and before ending of the read operation, firstly decreasing the voltages of the string selection line and the at least one dummy string selection line in advance, after the voltages of the string selection line and the at least one dummy string selection line are decreased, then increasing the voltage of the at least one bit line.

11. The operation method according to claim 10, wherein, before performing the read operation, a plurality of memory cells connected to a first word line and a second word line of the word lines have been performed a program operation and have a higher threshold voltage, the first word line is not adjacent to the second word line, and a channel region of the at least one memory string located between the first word line and the second word line has a channel potential.

12. The operation method according to claim 11, wherein, before ending of the read operation, the operation method comprises:

increasing the voltage of the at least one bit line in advance so as to generate band-to-band hot hole current in a junction region of the at least one bit line; and introducing the band-to-band hot hole current into the channel region of the at least one memory string to eliminate the down-coupled channel potential.

13. The operation method according to claim 12, wherein, before ending of the read operation, the operation method comprises:

firstly, decreasing the voltages of the string selection line and the at least one dummy string selection line from the pass voltage to zero (0V) or a negative voltage level in advance; and after the voltages of the string selection line and the at least one dummy string selection line are decreased, then increasing the voltage of the at least one bit line from a first pre-charge voltage to a first positive voltage level or a second positive voltage level.

14. The operation method according to claim 13, wherein, if the voltages of the string selection line and the at least one dummy string selection line are decreased from the pass voltage to zero (0V) in advance, then the voltage of the at least one bit line is increased from the first pre-charge voltage to the first positive voltage level, if the voltages of the string selection line and the at least one dummy string selection line are decreased from the pass voltage to the negative voltage level in advance, then the voltage of the at least one bit line is increased from the first pre-charge voltage to the second positive voltage level, and the second positive voltage level is lower than the first positive voltage level.

15. The operation method according to claim 13 comprises:

maintaining the voltage of the selected word line at the read voltage;

maintaining the voltages of the other unselected word lines, the ground selection line and the at least one dummy ground selection line at the pass voltage; and when of the read operation ends, ramping down the voltages of the selected word line, the other unselected word lines, the ground selection line and the at least one dummy ground selection line to zero (0V).

16. The operation method according to claim 15, wherein, when of the read operation ends, the operation method comprises:

in the period the voltages of the selected word line, the other unselected word lines, the ground selection line and the at least one dummy ground selection line are ramped down to zero (0V), maintaining the voltages of the string selection line and the at least one dummy string selection line at zero (0V) or the negative voltage level, and maintaining the voltage of the at least one bit line at the first positive voltage level or the second positive voltage level.

17. The operation method according to claim 13, before ending of the read operation, the operation method comprises:

decreasing the voltages of the string selection line and the at least one dummy string selection line from the pass voltage to zero (V) or the negative voltage level in advance to turn off at least one string selection transistor on the string selection line or the at least one dummy string selection line.

18. The operation method according to claim 13, comprises:

connecting the common source line and the P-well region to have equal potential; and maintaining the voltages of the common source line and the P-well region at a second pre-charge voltage.

* * * * *